(12) United States Patent
Lung

(10) Patent No.: US 9,001,550 B2
(45) Date of Patent: Apr. 7, 2015

(54) BLOCKING CURRENT LEAKAGE IN A MEMORY ARRAY

(75) Inventor: Hsiang-Lan Lung, Ardsley, NY (US)

(73) Assignee: Macronix International Co., Ltd., Hsinchu (TW)

( * ) Notice: Subject to any disclaimer, the term of this patent is extended or adjusted under 35 U.S.C. 154(b) by 267 days.

(21) Appl. No.: 13/458,644

(22) Filed: Apr. 27, 2012

(65) Prior Publication Data

US 2013/0286711 A1 Oct. 31, 2013

(51) Int. Cl.
| | | |
|---|---|---|
| G11C 11/00 | (2006.01) |
| H01L 45/00 | (2006.01) |
| G11C 17/06 | (2006.01) |
| G11C 29/00 | (2006.01) |
| G11C 13/00 | (2006.01) |
| G11C 29/08 | (2006.01) |
| G11C 29/44 | (2006.01) |

(52) U.S. Cl.
CPC ............... *G11C 17/06* (2013.01); *G11C 29/76* (2013.01); *G11C 29/83* (2013.01); *G11C 13/0004* (2013.01); *G11C 13/0069* (2013.01); *G11C 29/08* (2013.01); *G11C 2029/4402* (2013.01); *G11C 2213/72* (2013.01)

(58) Field of Classification Search
None
See application file for complete search history.

(56) References Cited

U.S. PATENT DOCUMENTS

| | | | |
|---|---|---|---|
| 3,922,648 A | 11/1975 | Buckley |
| 4,225,946 A | 9/1980 | Neale et al. |
| 4,228,524 A | 10/1980 | Neale et al. |
| 5,341,328 A | 8/1994 | Ovshinsky et al. |
| 6,762,952 B2 | 7/2004 | Munden et al. |
| 6,768,665 B2 | 7/2004 | Parkinson et al. |
| 6,781,906 B2 | 8/2004 | Perner et al. |
| 6,927,411 B2 | 8/2005 | Kozicki |
| 7,085,154 B2 | 8/2006 | Cho et al. |
| 7,190,607 B2 | 3/2007 | Cho et al. |
| 7,289,351 B1 | 10/2007 | Chen et al. |
| 7,365,355 B2 | 4/2008 | Parkinson |
| 7,505,330 B2 | 3/2009 | Pawlowski et al. |
| 7,539,050 B2 | 5/2009 | Philipp et al. |
| 7,558,105 B2 | 7/2009 | Suh |
| 7,571,901 B2 | 8/2009 | Philipp |
| 7,577,024 B2 | 8/2009 | Fackenthal et al. |
| 7,580,277 B2 | 8/2009 | Fuji |
| 7,656,701 B2 | 2/2010 | Lee et al. |
| 7,679,954 B2 | 3/2010 | Lee et al. |
| 7,751,227 B2 | 7/2010 | Fuji |
| 7,764,533 B2 | 7/2010 | Breitwisch et al. |
| 7,767,993 B2 | 8/2010 | Toda et al. |
| 7,796,424 B2 | 9/2010 | Happ et al. |
| 7,826,248 B2 | 11/2010 | Xi et al. |

(Continued)

*Primary Examiner* — James G Norman
(74) *Attorney, Agent, or Firm* — Haynes Beffel & Wolfeld LLP

(57) ABSTRACT

A method for blocking current leakage through defective memory cells in a memory array is provided. The memory cells include access devices and programmable resistance memory elements. The method includes identifying addresses of defective memory cells in the memory array, and applying a modifying bias condition to modify the defective memory cells at the identified addresses. The modifying bias condition causes the defective memory cells to transform into a current blocking condition. The method also includes storing the identified addresses in a redundancy table of addresses. An automatic test system includes a device tester adapted to identify addresses of defective memory cells in a memory array in an integrated circuit under test, and to apply a modifying bias condition to modify the defective memory cells at the identified addresses.

21 Claims, 12 Drawing Sheets

(56) References Cited

U.S. PATENT DOCUMENTS

| | | |
|---|---|---|
| 7,830,701 B2 | 11/2010 | Siau et al. |
| 7,863,594 B2 | 1/2011 | Akinaga et al. |
| 7,867,804 B2 | 1/2011 | Lee |
| 2001/0026949 A1* | 10/2001 | Ogawa et al. .................. 438/15 |
| 2003/0002331 A1 | 1/2003 | Park et al. |
| 2003/0123284 A1* | 7/2003 | Lowrey et al. ............... 365/175 |
| 2005/0275433 A1 | 12/2005 | Lee |
| 2006/0034112 A1 | 2/2006 | Oh et al. |
| 2007/0140029 A1 | 6/2007 | Kim et al. |
| 2007/0189053 A1* | 8/2007 | Pellizzer et al. ............... 365/96 |
| 2008/0019170 A1 | 1/2008 | Happ et al. |
| 2008/0048167 A1 | 2/2008 | Kostylev et al. |
| 2009/0008636 A1 | 1/2009 | Lee |
| 2009/0250678 A1 | 10/2009 | Osano et al. |
| 2009/0273968 A1 | 11/2009 | Lamorey et al. |
| 2010/0038614 A1 | 2/2010 | Hampton |
| 2010/0058018 A1* | 3/2010 | Kund et al. .................... 711/167 |
| 2010/0202186 A1* | 8/2010 | Sato et al. ..................... 365/148 |
| 2010/0214829 A1 | 8/2010 | Breitwisch et al. |
| 2010/0328995 A1 | 12/2010 | Shih et al. |
| 2011/0013446 A1 | 1/2011 | Lung |
| 2011/0103132 A1* | 5/2011 | Wei et al. ..................... 365/148 |
| 2011/0116309 A1 | 5/2011 | Lung |

* cited by examiner

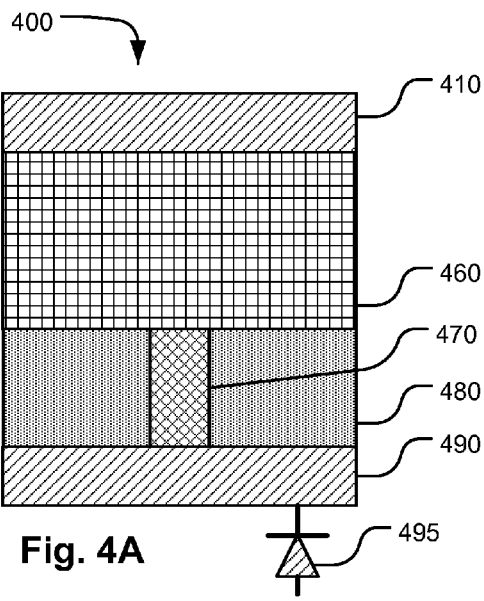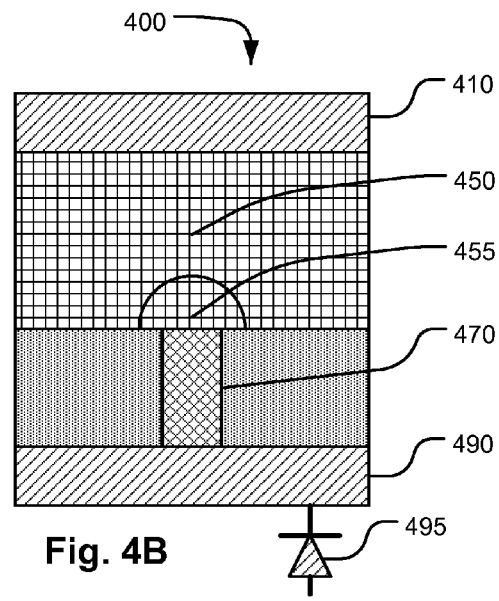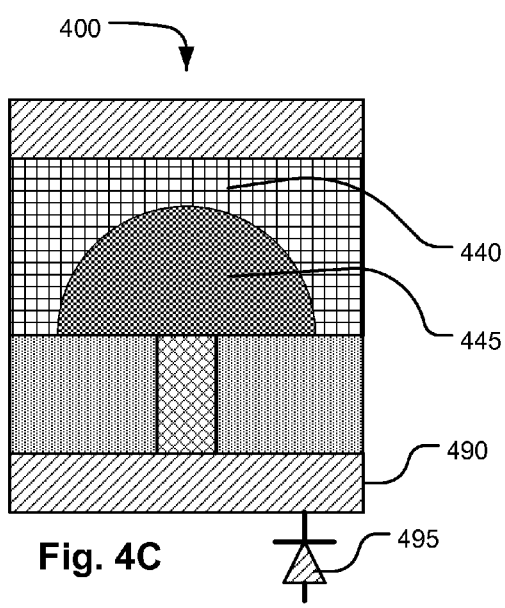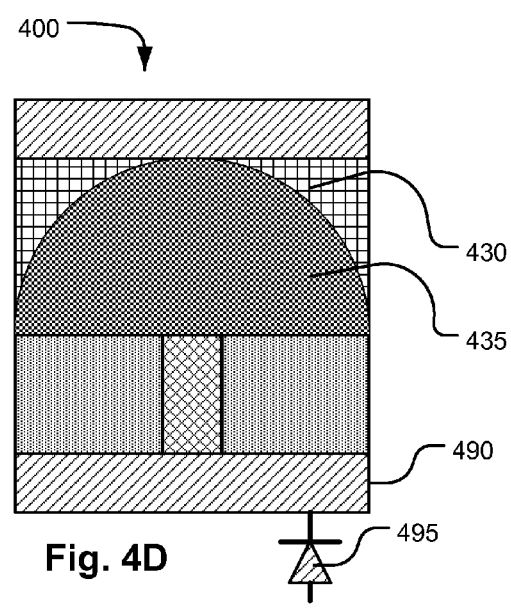

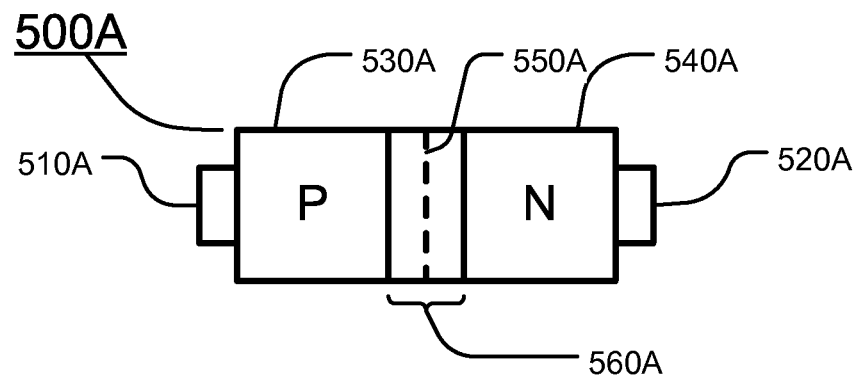
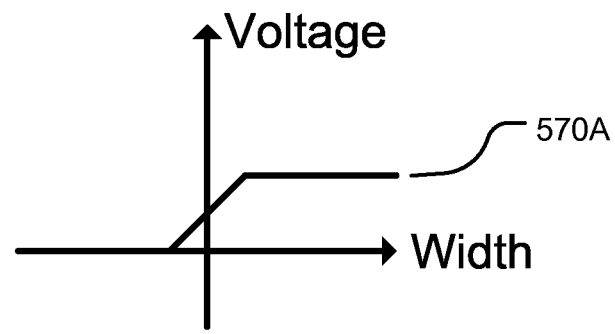
Fig. 5A
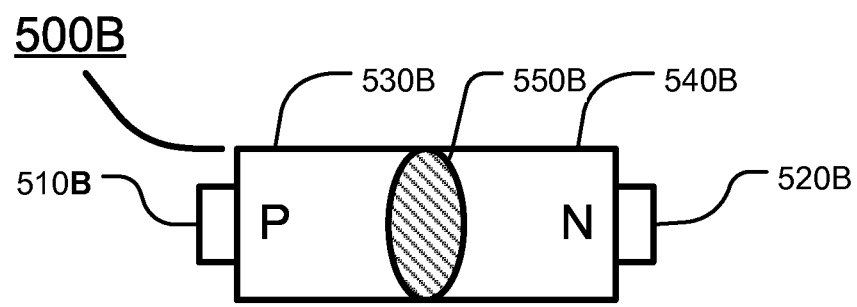
Fig. 5B

BLOCKING CURRENT LEAKAGE IN A MEMORY ARRAY

BACKGROUND OF THE INVENTION

1. Field of the Invention

The technology disclosed relates to memory devices based on phase change memory materials, like chalcogenides, and on other programmable resistance materials, and methods for manufacturing such devices.

2. Description of Related Art

In some programmable resistance memory array configurations, each memory cell includes a diode in series with a programmable resistance memory element. The diode acts as an access device, so that memory cells can be selected for operation by forward bias on the diode, while current flow in unselected memory cells is blocked by reverse bias on the diode. Thus, the biasing arrangements used in these configurations to access selected cells are set up to reverse bias the diodes in unselected cells. Some configurations utilize transistors for access devices, which are also subject to biasing arrangements for selected and unselected cells.

One type of programmable resistance memory element comprises phase change material that exhibit a large resistivity contrast between crystalline (low resistivity) and amorphous (high resistivity) phases. Phase change materials may include chalcogenides, and other alloys of materials such as germanium (Ge), antimony (Sb), tellurium (Te), gallium (Ga), indium (In), silver (Ag), selenium (Se), thallium (Ti), bismuth (Bi), tin (Sn), copper (Cu), palladium (Pd), lead (Pb), sulfur (S), and gold (Au). In normal operation of a phase change memory element, an electrical current pulse passed through the phase change memory cell can set or reset the resistivity phase of the phase change memory element. To reset the memory element into the amorphous phase, an electrical current pulse with a large magnitude for a short time period can be used. To set the memory element into the crystalline phase, an electrical current pulse with a medium magnitude and a longer time period can be used. To read the state of the memory element, a small voltage is applied to the selected cell and the resulting electrical current is sensed. The sensed current may have at least two current levels, one very low for a high resistance state, and another higher for a low resistance state. Accordingly, an electrical current is used when an operation is needed to set, reset or read the resistivity state of a selected memory cell. During such operations, it is desirable that no current passes through the unselected memory cells, because undesired current flow might cause disturbance of the data values stored in the unselected cells, or contribute leakage current that can interfere with a successful read of the selected cell or cells. However, a defective access device can have a permanent ON state, or leaky state, and conduct an electrical current even under biasing applied to unselected cells. The resulting current leakage increases the power consumption of the memory array in a memory chip, and can reduce the electrical current that reaches the target cells for reset, set or read operations in the memory array.

Programmable resistance elements other than phase change memory elements, such as metal oxide memory elements, solid state electrolyte (conductive bridge) memory elements, magnetoresistive memory elements, and so on, involve biasing adapted for their respective characteristics, and are susceptible to current leakage as well, when access devices are defective.

It is desirable to provide technology which can block current leakage and reduce power consumption in a memory array caused by defective selecting devices such as shorted diodes.

SUMMARY OF THE INVENTION

The present invention provides a method for blocking current leakage and reducing power consumption through defective memory cells in a memory array. The memory cells include access devices, such as diodes or transistors, and programmable resistance memory elements coupled to the access devices. Current leakage can be blocked by identifying addresses of defective memory cells in the memory array, and applying a modifying bias condition to modify the defective memory cells at the identified addresses. The modifying bias condition causes the defective memory cells to transform into a current blocking condition. The addresses of modified memory cells can be stored in a redundancy table of addresses.

An automatic test system is described that includes a device tester adapted to identify addresses of defective memory cells in a memory array in an integrated circuit under test, and to apply a modifying bias condition to modify the defective memory cells at the identified addresses.

Other aspects and advantages of the present invention can be seen on review of the drawings, the detailed description and the claims, which follow.

BRIEF DESCRIPTION OF THE DRAWINGS

FIG. 4A through FIG. 4D illustrate cross-sectional views of a mushroom-type memory cell structure in various conditions.

FIG. 5A illustrates a simple pn-junction diode.

FIG. 5B illustrates a simple burned out, or modified, pn-junction diode in a current blocking condition.

DETAILED DESCRIPTION

A detailed description of embodiments of the present technology is provided with reference to the FIGS. 1 to 12A-12B. Preferred embodiments are described to illustrate an invention or inventions described herein, not to limit its or their scope, which is defined by the claims. Those of ordinary skill in the art will recognize a variety of equivalent variations on the description that follows.

Figure 1:
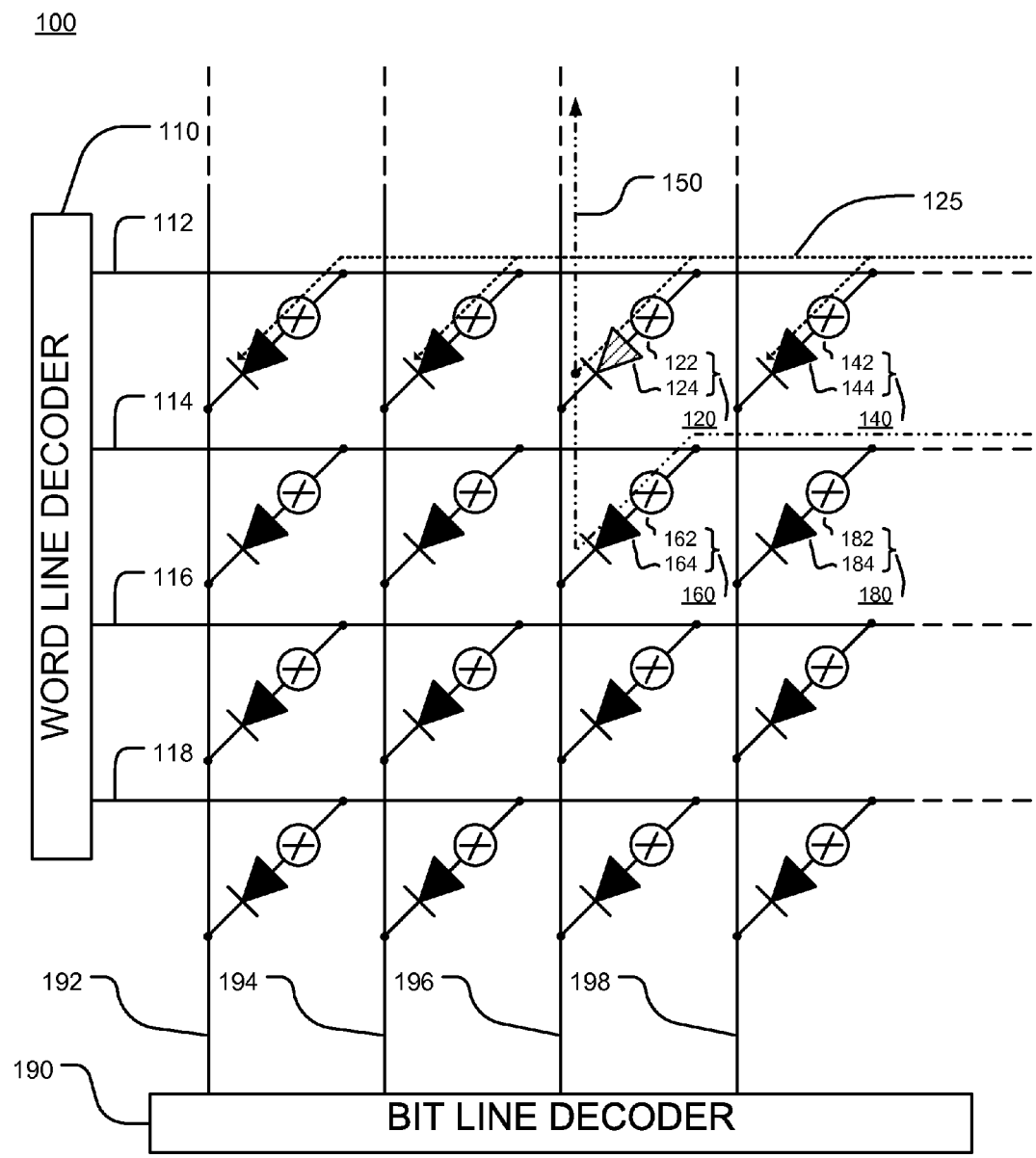
FIG. 1 is a schematic diagram of a memory array illustrating a normal current path.

The present technology provides a method for blocking current leakage and reducing power consumption through cells including defective access devices in a memory array. FIG. 1 is a schematic diagram of a memory array 100, including diode access devices, illustrating a normal current path 150 through a functioning selected memory cell 160. The memory array 100 includes a matrix of memory cells, a plurality of word lines and a plurality of bit lines. Each of the memory cells in the example memory array 100 includes an access diode and a memory element in series between a corresponding word line and a corresponding bit line. Each memory element is electrically coupled to a corresponding access diode. For example, memory cells 120, 140, 160 and 180 include phase change memory elements 122, 142, 162 and 182 electrically coupled to access diodes 124, 144, 164 and 184, respectively.

The plurality of bit lines including bit lines 192, 194, 196 and 198 extend in parallel along a first direction. The bit lines 192, 194, 196 and 198 are in electrical communication with the bit line decoder 190. Cathodes or anodes of diodes may be connected to bit lines. For example, the cathodes of diodes 144 and 184 are connected to a common bit line 198 while the cathodes of diodes 124 and 164 are connected to a common bit line 196.

The plurality of word lines including word lines 112, 114, 116 and 118 extend in parallel along a second direction. The word lines 112, 114, 116 and 118 are in electrical communication with the word line decoder 110. Phase change memory elements may be connected between anodes or cathodes of diodes and bit lines. For example, the phase change memory element 142 is connected between the anode of diode 144 and the word line 112 while the phase change memory element 122 is connected between the anode of diode 124 and the word line 112. The word line 112 is common to the phase change memory elements 122 and 142 while the word line 114 is common to the memory elements 162 and 182. It should be noted that the sixteen memory cells in FIG. 1 are shown for convenience of discussion but, in practice, a phase change memory array may comprise thousands to millions of such memory cells.

In FIG. 1, selected memory cell 160 includes a diode 164, which operates normally and conducts an electrical current through a normal current path 150 between word line 114 and bit line 196. The diode 164 does not begin conducting electricity until a bias voltage is present across the diode 164 and greater than the threshold voltage of a functioning diode in the forward direction. However, diode 124 in the unselected memory cell 120 is defective and stays at a permanent ON or leaky state. The diode 124 leaks an electrical current through a current path 125 between word line 112 and bit line 196 even when the voltage across the diode 124 is below the threshold voltage of a functioning diode. The leakage current through the diode 124 interferes with the effective read/write current on the bit line 196 for the selected memory cell 160. The electrical current through the word line 112 to other bit lines is blocked by other unselected memory cells.

Figure 2:
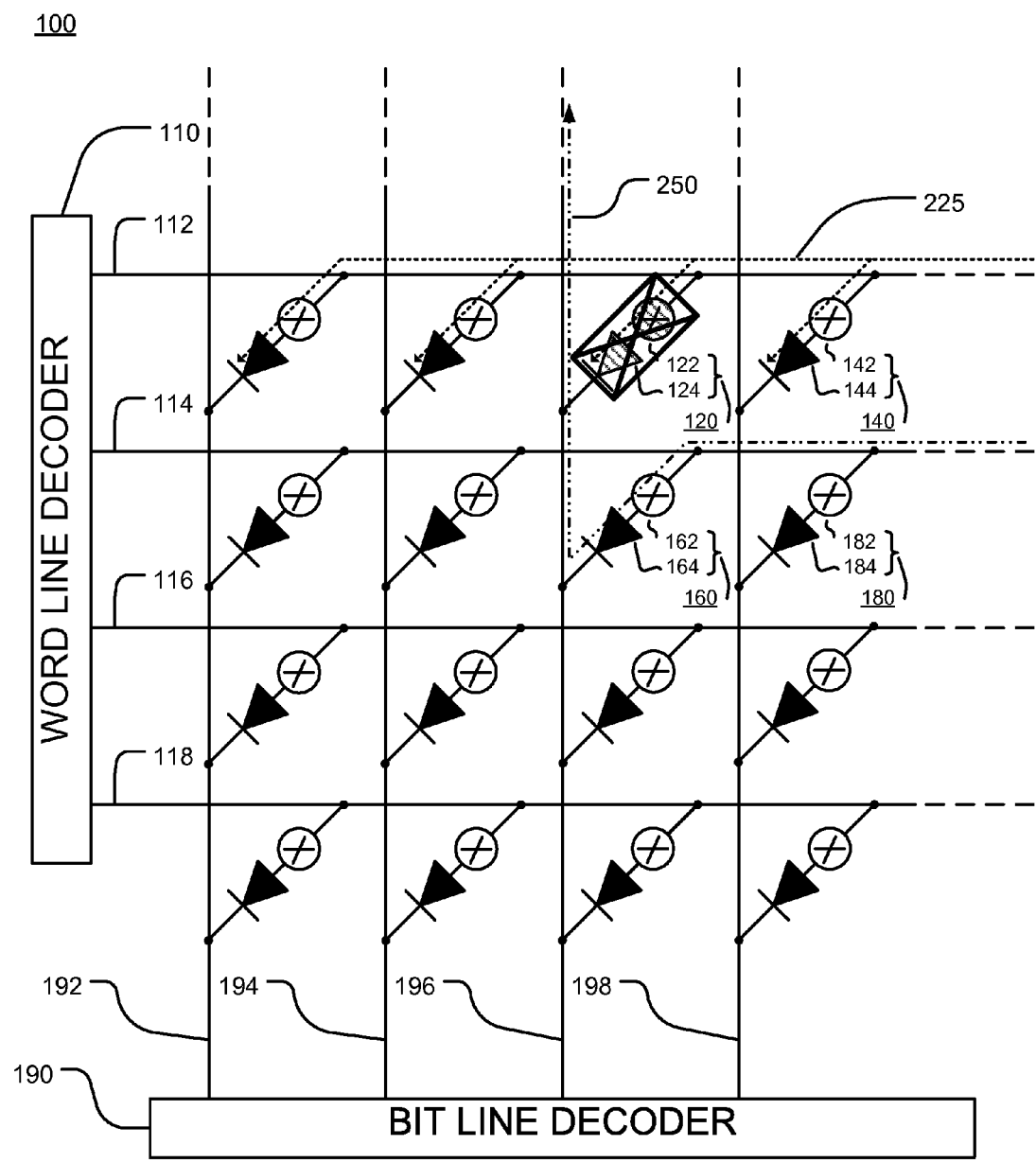
FIG. 2 is a schematic diagram of a memory array illustrating a leakage current path.

In FIG. 2, the defective memory cell 120 has been modified such that the cell has been transformed into a current blocking condition, by modifying the diode 124, the phase change memory element 122, the interfaces between such elements, or between either one of such elements and the corresponding word line or bit line. The modified defective memory cell blocks electrical current from the current path 225 so the leaking electrical current does not interfere with the electrical current from the current path 250 through the selected memory cell 160.

Figure 3:
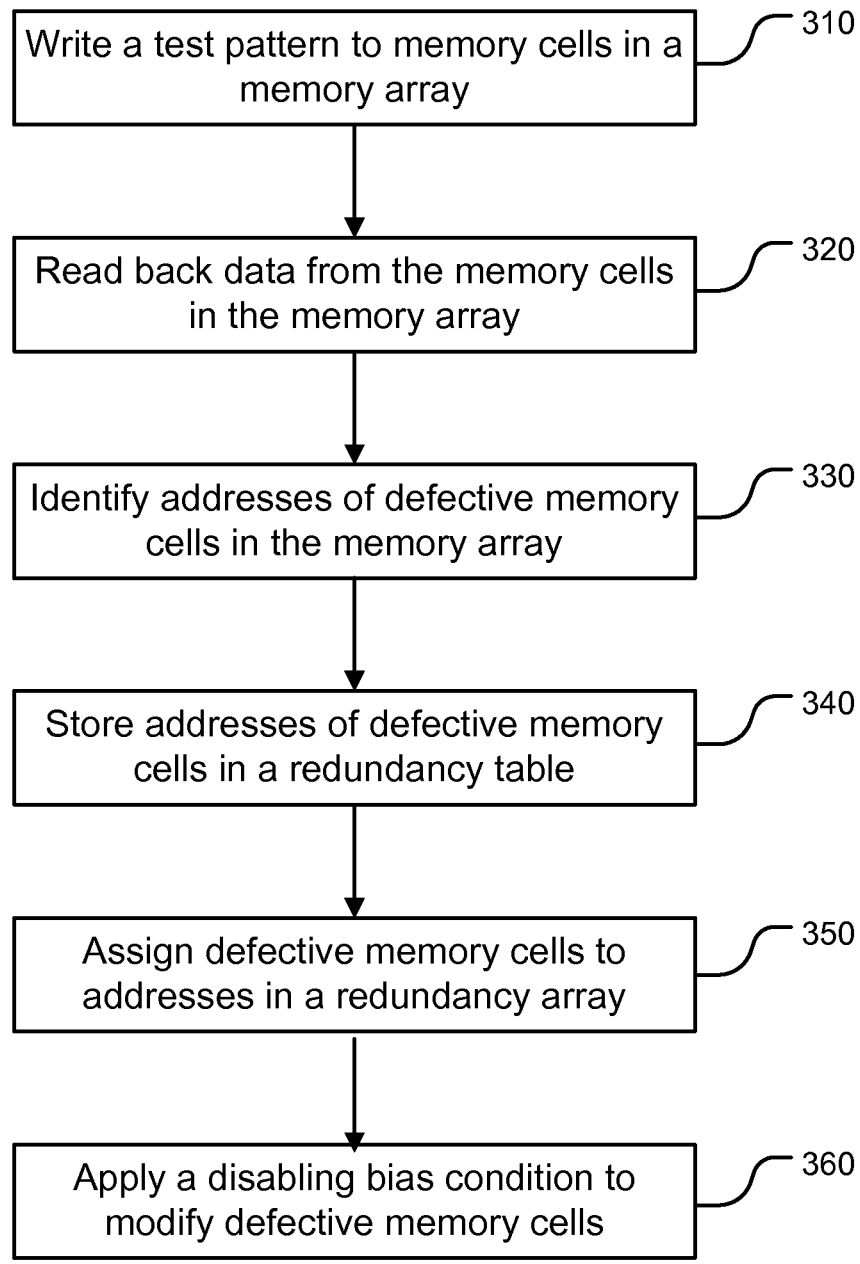
FIG. 3 is a flowchart of a method to block leakage current in a memory array.

FIG. 3 is a flowchart that illustrates a method for manufacturing a memory device that includes modifying defective memory cells. For convenience, actions 310-360 identified in this flow chart are described with respect to an automatic test system that can perform the actions. The actions described can be combined in a variety of ways and expressed in a variety of methods. For instance, FIG. 9 combines the actions described in FIG. 3 in an alternative way.

In Step 310 in FIG. 3, the system writes a test pattern to memory cells at some or all memory addresses in the memory array during manufacturing. A test pattern may set some or all memory cells in the memory array to logic ones, logic zeros or combinations of logic ones and logic zeros. Test patterns may be automatically generated using algorithms developed for detecting defects in the memory cells. In Step 320, the system reads back data from the memory cells at the addresses to which the test pattern has been written. In Step 330, the system compares the data read back from the addresses with the data written to the addresses. The system then identifies addresses of defective memory cells.

In Step 340, the system stores the addresses of the identified defective memory cells in a redundancy table. In step 350, the system assigns a corresponding redundant address for each defective memory cell. The redundant address refers to the address of a memory cell in a redundant array. Redundant arrays can be implemented in a variety of forms, including for example a set of redundant columns and/or a set of redundant rows of memory cells of the same basic type as used in the memory array. The system also stores the redundant address in the redundancy table such that an attempted access to a defective memory cell can be redirected to the corresponding redundant address. The size of the redundant array depends on such factors as the size of the memory array, and/or the number of defective cells expected. In Step 360, the system applies a modifying bias condition to modify the defective memory cells. The modifying bias condition causes a modification of the defective memory cells to transform into a current blocking condition, some examples of which are described below. Upon modification, the addresses stored in the redundancy table are the addresses of the modified defective memory cells.

During user operation, memory cells in the redundant array are used instead of the defective memory cells so that, logically, the memory array does not have any defective addresses. However, as described above, modified defective memory cells do not leak sufficient current to interfere with operations, including read operations, targeting other cells.

FIG. 4A through FIG. 4D illustrate cross-sectional views of a mushroom-type memory cell structure in a memory array in various conditions. In FIG. 4A, memory cell 400 includes a top electrode 410 which can be a bit line, a heater or bottom electrode 470, insulator 480 surrounding the bottom electrode 470, programmable resistance material 460 coupled to the top electrode 410 and the bottom electrode 470, a contact 490 coupled to the bottom electrode 470, and an access device, such as a defective diode 495 couple to the contact 490. The memory cell 400 in the example shown includes a phase change memory material having an active region which changes phase under bias conditions applied during operation of the array. Other memory materials can be utilized as well.

In many embodiments of phase change memory, before any programming, the programmable resistance material 460 is in a crystalline or low resistance state. During operation, an active region may be reset into an amorphous or high resistance state or set into a crystalline or low resistance state. An active region in the programmable resistance material 460 is in contact with the heater or bottom electrode 470. For convenience of discussion, the region outside the active region in the programmable resistance material 460 is referred to as the inactive region. The magnitude and timing of a current pulse provided to program the active region, by the set and reset operations for phase change memory materials for example, determines the size of the active region and accordingly the size of the inactive region. For normal programming operation, FIG. 4B illustrates the active region 455 in contact with the bottom electrode 470 and the inactive region 450 coupling the active region 455 to the top electrode 410. The size of the active region for all the memory cells in the array can vary, depending on manufacturing variations and the like. However, such size can be defined for an array, by simulation or by statistical metrology that provides a reliable measure that can be used for the purposes of design and analysis of such arrays. Of course the volume of material that can be induced to adopt the amorphous phase in formation of a modified defective cell need not match that of the active region that is involved in normal operation of memory cells in the array.

The active region 455 for phase change memory cells may be reset into an amorphous or high resistance state or set into a crystalline or low resistance state. In normal programming operation, a melting-then-quenching process is used to reset the memory cell where a large electrical current is applied through the memory cell for a short time period to first melt and then rapidly quench the active region 455. To set the memory cell, a medium electrical current with a time period long enough to crystallize is applied to anneal the active region 455. The active region 455 can be in series with the inactive region 450. In some embodiments, the active region 455 can span the region between the bottom electrode 470 and the top electrode 410. The resistance state of the programmable resistance memory cell 400 is determined by the resistance state of the active region 455.

As mentioned above, the system applies a modifying bias condition to modify the defective memory cells. The modifying bias condition causes the defective memory cells to transform into a current blocking condition. In one embodiment, the system applies a first modifying bias condition that causes a first electrical current pulse or pulses which induce a volume of the phase change material (e.g. region 445 in FIG. 4C) that can be larger than the normal active region (e.g. region 455 in FIG. 4B) in the memory element to form into an amorphous phase, so that the cell has a high resistance state. In a melting-then-quenching process similar to that used in normal operation to reset a memory cell, the first electrical current melts a modified active region 445 (FIG. 4C) in the programmable resistance memory cell 400 and then rapidly quenches it. The modified active region 445 is reset to an amorphous or high resistance state. The corresponding inactive region 440 in FIG. 4C has been reduced from the inactive region 450 in FIG. 4B and remains at a low resistance state. Because redundancy circuitry can prevent selection of the modified cell during read, set or reset operations, only bias conditions for unselected cells should be encountered at the modified cell. The electrical current encountered during normal operation that disturbs the modified defective cell memory cell should not be large enough to set the modified active region back to a low resistance state. Consequently, the programmable resistance memory cell 400 with the modified active region 445 reset to an amorphous or high resistance state stays at a permanent amorphous or high resistance state.

In a second embodiment, the system applies a modifying bias condition that causes an electrical current pulse or pulses to cause a volume of the phase change material that extends from a bottom electrode to a top electrode in the memory element to form into a high resistance state. In a melting-then-quenching process similar to that used in the normal operation to reset a memory cell, the second electrical current pulse or pulses induce a volume or, a "maximum" active region 435 (FIG. 4D) that includes most or all of the programmable resistance material 460 on a path from the heater or bottom electrode 470 to the top electrode 410, and to adopt a high resistance, amorphous phase. The maximum active region 435 is thus reset to a high resistance state while the corresponding inactive region 430 has been reduced to almost non-existence. The electrical current encountered during normal operation that disturbs the modified defective cell is not large enough to set the maximum active region back to a low resistance state. Consequently, the programmable resistance memory cell 400 with the maximum active region 435 reset to a high resistance state, acts essentially as an open circuit.

In a third embodiment, the system applies a modifying bias condition that causes a electrical current pulse or pulses to render the defective diode, or other access device, electrically non-conductive. The electrical current pulse may burn out the defective access device so it becomes an open circuit. FIG. 5A illustrates a sample pn-junction diode 500A that includes a cathode 520A and an anode 510A. The diode 500A is made with n-type material 540A and p-type material 530A. The n-type material 540A is coupled to the cathode 520A. The p-type material 530A is coupled to the anode 510A. A pn-junction 550A is formed between the n-type material 540A and the p-type material 530A. The pn-junction 550A has a depletion region 560A around it and a barrier voltage of 570A.

Normally, a pn-junction diode conducts electrical current when the anode is more positive than the cathode by more than a barrier voltage. The n-type material and the p-type material may be silicon doped with impurities such as arsenic (As). When the n-type material and the p-type material are joined, they form a pn-junction that, ideally, acts as a closed switch when it is forward biased and as an open circuit when it is reverse biased. The pn-junction has a depletion region around it. The width of the depletion region determines the barrier voltage and depends on the density of doped impurities.

When a high enough current pulse is applied through the defective diode, a thermal process may trigger a chemical reaction such as oxidation that at least partially transforms semiconductor materials, the surface interfaces or both in the defective diode, or cause formation of a void, to cause an open circuit or high resistance condition. The open circuit may be a void where a pn-junction is normally formed between p-type and n-type materials. Consequently, the diode is modified to a current blocking condition.

FIG. 5B heuristically illustrates a sample burned out pn-junction diode 500B that includes a cathode 520B and an anode 510B. The diode 500B is originally made with n-type material 540B and p-type material 530B. The n-type material 540B is coupled to the cathode 520B. The p-type material 530B is coupled to the anode 510B. Where a pn-junction is normally formed, a void 550B is formed by the third electrical current such that the diode becomes non-conductive. A similar biasing process can be applied to "burn out" of, or cause void formation in, other types of access devices, such as MOS transistors and bipolar transistors, as well, so that they adopt a current blocking condition.

Descriptions of the present technology with reference to FIGS. 4A-4D use a mushroom-type memory cell structure as an example. In general, memory cell structures of the present technology may include, but are not limited to, a mushroom-type memory cell structure, a bridge-type memory cell structure, an active-in-via type memory cell structure, and a pore-type memory cell structure. Those memory structures are further described below.

Figure 6:
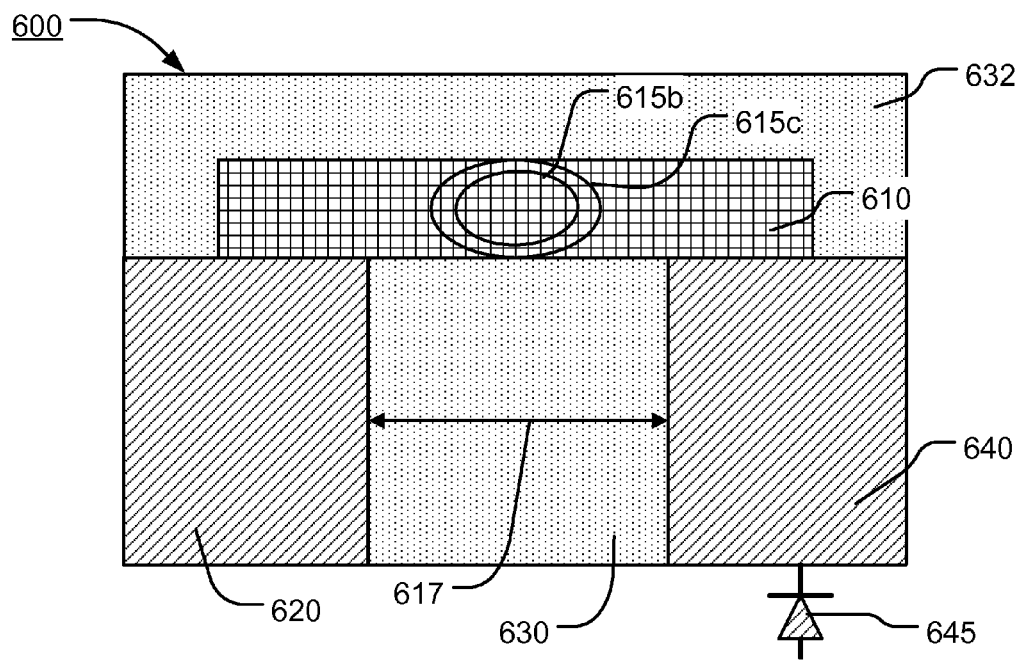
FIG. 6 illustrates a cross-sectional view of a bridge-type memory cell structure.

FIG. 6 illustrates a cross-sectional view of a bridge-type memory cell structure. Memory cell 600 includes a dielectric spacer 630 separating first and second electrodes 620 and 640. Dielectric materials 632 surround a programmable resistance memory material 610. The memory material 610 extends across the dielectric spacer 630 to contact the first and second electrodes 620, 640, thereby defining an inter-electrode current path between the first and second electrodes 620, 640 having a path length defined by the width 617 of the dielectric spacer 630. The memory cell includes an access device, such as a defective diode 645, coupled to the electrode 640. The dielectric materials 632 may include, for example, dielectric materials like $SiO_2$, $Si_3N_4$, $SiO_xN_y$, or $Al_2O_3$.

As mentioned above, the system applies a modifying bias condition to modify the defective memory cells. The modifying bias condition causes the defective memory cells to transform into a current blocking condition. In one embodiment, the system applies a first modifying bias condition that causes a first electrical current pulse or pulses to cause a volume of the phase change material to form into an amorphous or high resistance state. In a melting-then-quenching process similar to that used in normal operation to reset a memory cell, the first electrical current melts a modified active region in the memory material 610 and then rapidly quenches it. The modified active region includes and can be larger than the normal active region 615a shown in FIG. 6. The modified active region is reset to an amorphous or high resistance state. The electrical current encountered during normal operation that disturbs the modified defective cell memory cell is not large enough to set the modified active region 615b back to a crystalline or low resistance state. Consequently, the programmable resistance memory material 610 with the modified active region 615b reset to an amorphous or high resistance state stays at a permanent amorphous or high resistance state. As mentioned above, in an alternative embodiments, the access device (e.g. defective diode 645) is modified rather than or in addition to the memory material, by a current pulse that causes void formation, burn out, or other change that renders the defective access device non-conductive.

Figure 7:
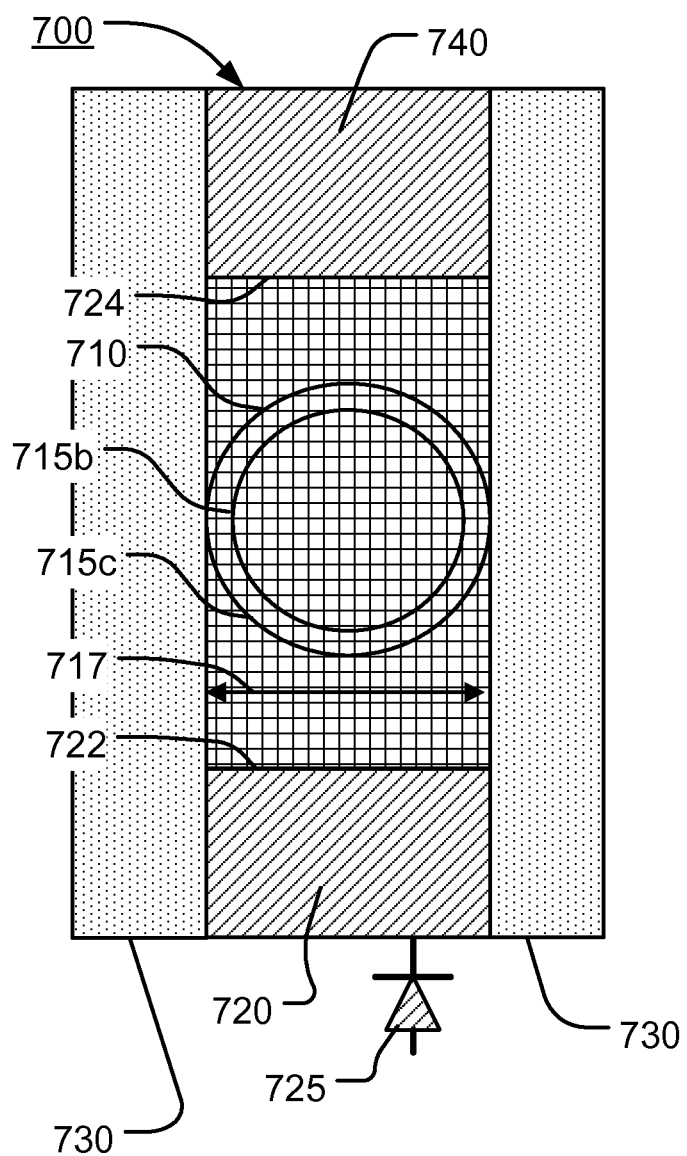
FIG. 7 illustrates a cross-sectional view of an "active-in-via" type memory cell structure.

FIG. 7 illustrates a cross-sectional view of an "active-in-via" type memory cell structure. Memory cell 700 includes a memory material 710 contacting first and second electrodes 720, 740 at top and bottom surfaces 722, 724, respectively. Dielectric materials 730 surround the memory material 710. The memory material 710 has a width 717 substantially the same in this example, as that of the first and second electrodes 720, 740 to define a multi-layer pillar surrounded by dielectric. As used herein, the term "substantially" is intended to accommodate manufacturing tolerances. The memory cell includes an access device, such as a defective diode 725, coupled to the electrode 720.

As mentioned above, the system applies a modifying bias condition to modify the defective memory cells. The modifying bias condition causes the defective memory cells to transform into a current blocking condition.

Figure 8:
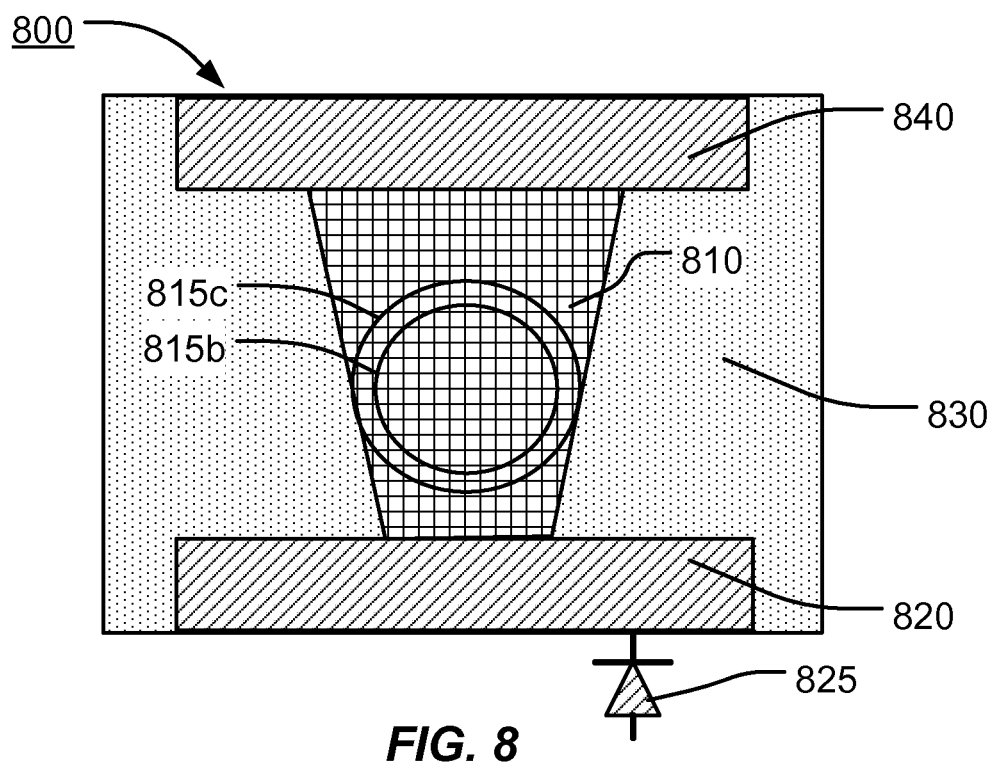
FIG. 8 illustrates a cross-sectional view of a pore-type memory cell structure.

FIG. 8 illustrates a cross-sectional view of a pore-type memory cell structure. Memory cell 800 includes a memory material 810. Dielectric materials 830 surround the memory material 810. The memory material 810 is surrounded by dielectric materials 830 and contact first and second electrodes 820, 840 at top and bottom surfaces, respectively. The memory material 810 has a width less than that of the first and second electrodes. The memory cell includes an access device, such as a defective diode 825, coupled to the electrode 820.

As mentioned above, the system applies a modifying bias condition to modify the defective memory cells. The modifying bias condition causes the defective memory cells to transform into a current blocking condition.

Figure 9:
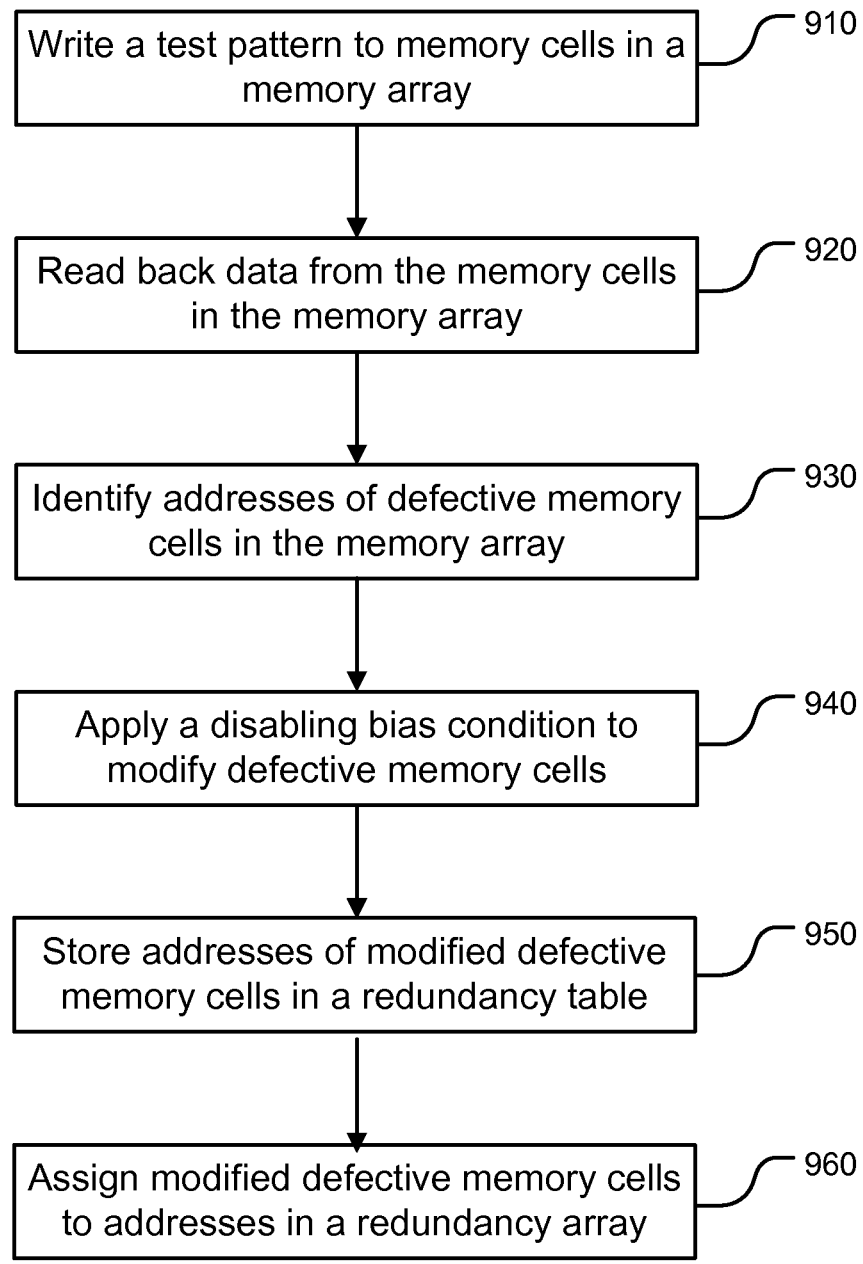
FIG. 9 is a flowchart of an alternative method to block leakage current in a memory array.

An alternative process flow, compared to that of FIG. 3, is shown in FIG. 9. In this alternative, the system applies a modifying bias condition to modify the defective memory cells before it stores addresses of defective memory cells in a redundancy table. Aspects of the embodiment shown in FIG. 3 and detailed descriptions about FIG. 3 above may generally be combined with the embodiment shown in FIG. 9. In Step 910 in FIG. 9, the system writes a test pattern to memory cells at some or all memory addresses in the memory array during manufacturing. In Step 920, the system reads back data from the memory cells at the addresses to which the test pattern has been written. In Step 930, the system compares the data read back from the addresses with the data written to the addresses. The system then identifies defective memory cells.

In Step 940, the system applies a modifying bias condition to defective memory cells such that they become electrically non-conductive. In Step 950, the system stores the addresses of the identified defective memory cells in a redundancy table. In step 990, the system assigns a corresponding redundant address for each modified defective memory cell.

Figure 10:
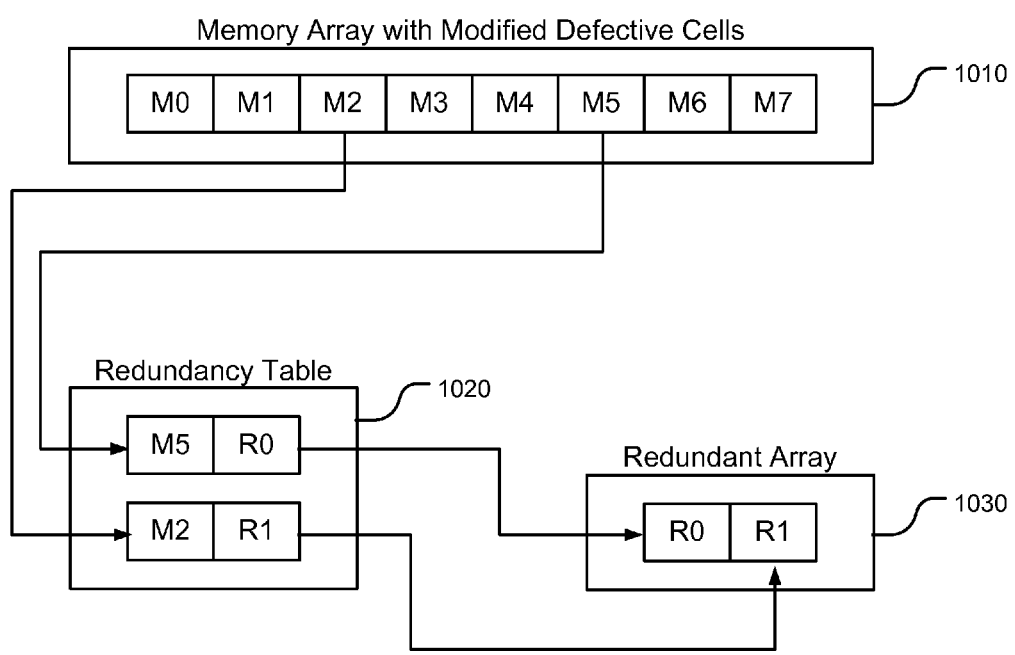
FIG. 10 illustrates redundancy assignments for modified defective memory cells.

FIG. 10 illustrates a simplified example of redundancy assignments for defective memory cells in memory array with modified defective cells 1010. During testing as part of manufacturing in this example, the automatic test system detects and modifies two defective memory cells at addresses M2 and M5 in the memory array. The system then records the addresses of the modified defective memory cells M2 and M5 in the redundancy table 1020 and assigns redundant addresses R1 and R0, respectively, in the redundant array 1030. The system also records redundant addresses R1 and R0 in the redundancy table 1020 in relation to M2 and M5, respectively. During user operation, when the address of a defective memory cell is received and found in the redundancy table 1020, the respective redundant address of the defective memory cell in the redundancy table 1020 is provided to the address decoders. For example, if the address M2 is received, then the redundant address R1 is provided to the address decoders.

Figure 11:
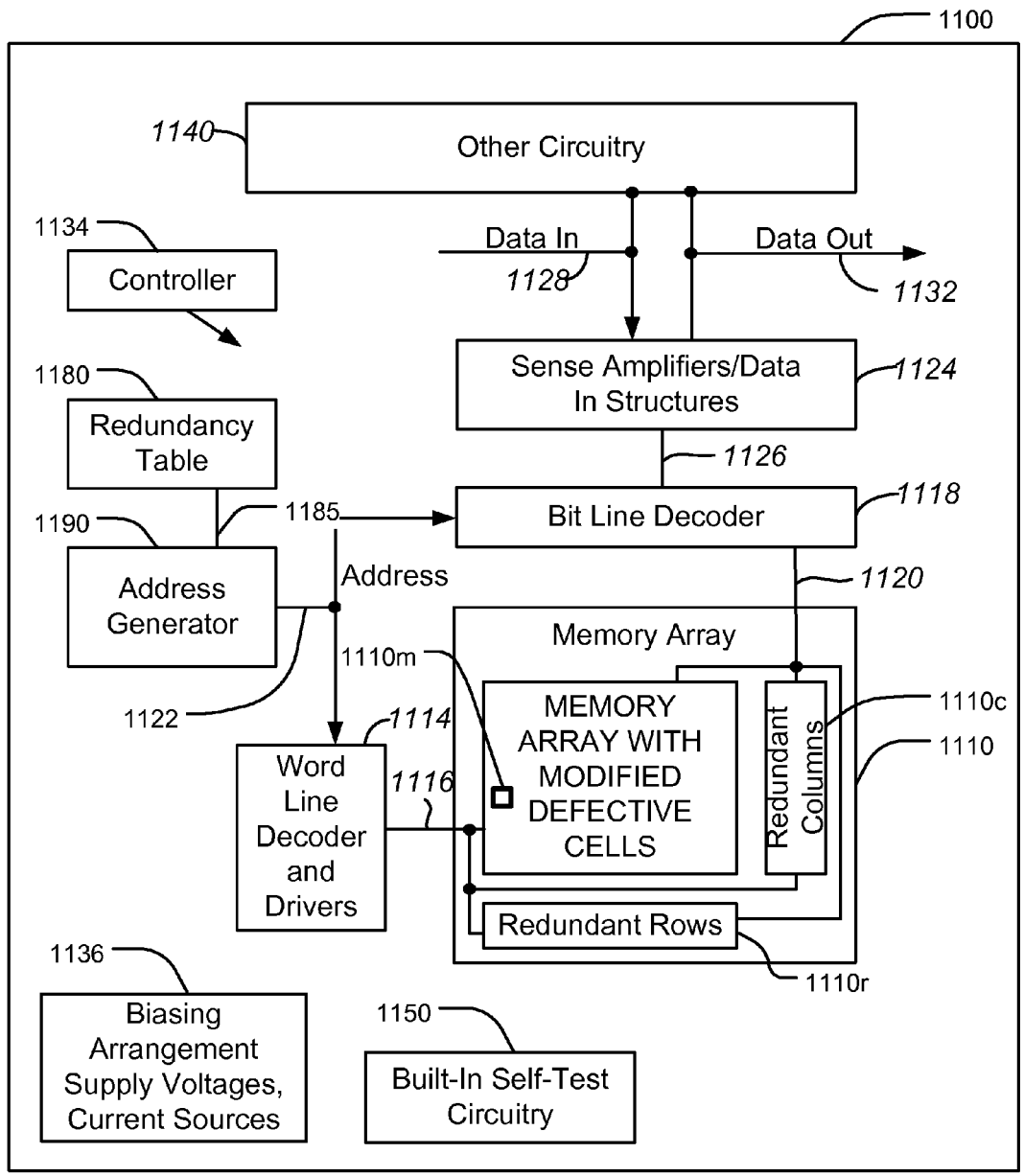
FIG. 11 is a block diagram of an example integrated circuit.

FIG. 11 is a simplified block diagram of an example integrated circuit 1100 including a memory array 1110, a redundant array (1110r, 1110c), and a redundancy table 1180. The memory array 1110 includes memory cells including diodes, or other access devices, and programmable resistance memory elements coupled to the diodes or other access devices. The memory cells are exposed to bias conditions during operation of the memory array 1110. The programmable resistance memory elements can include phase change materials that have an active region which changes phase under bias conditions applied during operation of the memory array 1110. The memory array 1110 also includes a plurality of modified defective memory cells in a current blocking condition. The redundant array includes replacement memory cells. The redundancy table 1180 maps addresses of modified defective memory cells in the memory array 1110 to replacement memory cells in the redundant array. The modified defective memory cells each include a modified access device or a modified memory element in a current blocking condition for forward and reverse bias.

In FIG. 11, the memory array 1110 includes a memory array with modified defective cells 1110m. The redundant array includes a set of redundant columns 1110c of memory cells and/or a set of redundant rows 1110r of memory cells. The redundant array is represented by redundant columns 1110c, and redundant rows 1110r. Bus 1122 addresses memory cells in the memory array with modified defective cells 1110m, the redundant columns 1110c, and the redundant rows 1110r. In alternative embodiments, the redundant array may include only a set of redundant columns or only a set of redundant rows. The size of the redundant array depends on such factors as the size of the memory array with modified defective cells 1110m, and/or the number of defective cells expected. In other embodiments, the redundant array may be separate from the main memory array 1110, and can be implemented using the same or different memory cell technologies.

During manufacturing of a memory chip including a memory array such as the memory array 1110, modified defective cells in the memory array with modified defective cells 1110m are detected and modified. Addresses of the modified defective cells are identified and stored in the redundancy table 1180. The redundancy table maps addresses of the modified defective cells to replacement memory cells in the redundant array.

During user operation, address generator 1190 first generates, or receives, an address available in the memory array with modified defective cells 1110m. If the address in the memory array with modified defective cells 1110m is found in the redundancy table 1180 via redundancy address bus 1185, then the memory cell at the address has been determined to be a defective memory cell. A corresponding redundant address has been assigned for the defective memory cell and is available in the redundancy table 1180 for a memory cell in the redundant column 1110c or in the redundant row 1110r of the memory array 1110. Instead of the address in the memory array with modified defective cells 1110m for the defective memory cell, the address generator 1190 provides the redundant address for the defective memory cell to the address bus 1122.

In FIG. 11, a word line decoder 1114 is coupled to and in electrical communication with a plurality of word lines 1116 in the memory array 1110. A bit line decoder 1118 is in electrical communication with a plurality of bit lines 1120 in the memory array 1110 for reading, setting, and resetting the memory cells in the memory array 1110. Addresses are supplied on bus 1122 to word line decoder and drivers 1114 and bit line decoder 1118. Sense amplifiers and data-in structures in block 1124, including voltage and/or current sources for the read, set, and reset modes are coupled to bit line decoder 1118 via data bus 1126. Data is supplied via a data-in line 1128 from input/output ports on integrated circuit 1100, or from other data sources internal or external to integrated circuit 1100, to data-in structures in block 1124. Other circuitry 1140 may be included on integrated circuit 1100, such as a general purpose processor or special purpose application circuitry, or a combination of modules providing system-on-a-chip functionality supported by a memory array 1110. Data is supplied via a data-out line 1132 from the sense amplifiers in block 1124 to input/output ports on integrated circuit 1100, or to other data destinations internal or external to integrated circuit 1100.

A controller 1134 implemented, in this example, using a bias arrangement state machine, controls the application of bias arrangement supply voltages and current sources 1136, such as read, set, reset, and program verify voltages and/or currents for both the memory array 1110 and the redundant array. Controller 1134 may be implemented using special-purpose logic circuitry as known in the art. In alternative embodiments, controller 1134 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1134.

Built-in self-test circuitry (BIST) can be included on the integrated circuit 1100, which incorporates logic used to execute testing methods for an integrated circuit. BIST circuitry 1150 in the example integrated circuit 1100 performs, or supports, the methods identified in the flowchart in FIG. 3 and alternatively in the flowchart in FIG. 6. For example, the BIST 1150 can include logic to identify addresses of defective memory cells in the memory array 1110. The BIST 1150 can include logic to apply a modifying bias condition to modify the defective memory cells at the identified addresses and thereby form modified defective memory cells that have a current blocking condition. Logic included in the BIST 1150 can also store the identified addresses of defective memory cells in the redundancy table 1180. The BIST 1150 can be used to execute the processes described herein in cooperation with the controller 1134, can be controlled by an external processor such as automatic test equipment to execute the processes described herein, or can be controlled by a combination of the on-chip controller 1134 and an external processor.

In one embodiment, to modify the defective memory cells at the identified addresses, the BIST 1150 applies, or causes the application of, a first modifying bias condition that causes a first electrical current pulse or pulses to cause a volume of the phase change material to form into a high resistance state. In a second embodiment, the BIST 1150 applies, or causes the application of, a second modifying bias condition that causes a second electrical current pulse or pulses to cause a volume of the phase change material that extends from a bottom electrode to a top electrode in the memory element to form into a high resistance state. In a third embodiment, the BIST 1150 supplies, or causes the application of, a third modifying bias condition that causes a third electrical current pulse or pulses to render the defective access device electrically non-conductive.

The memory array 1110 in the integrated circuit 1100 may include memory cells using transistors as access devices, instead of diodes as described above in the memory array with modified defective cells 1110m.

Figure 12A:
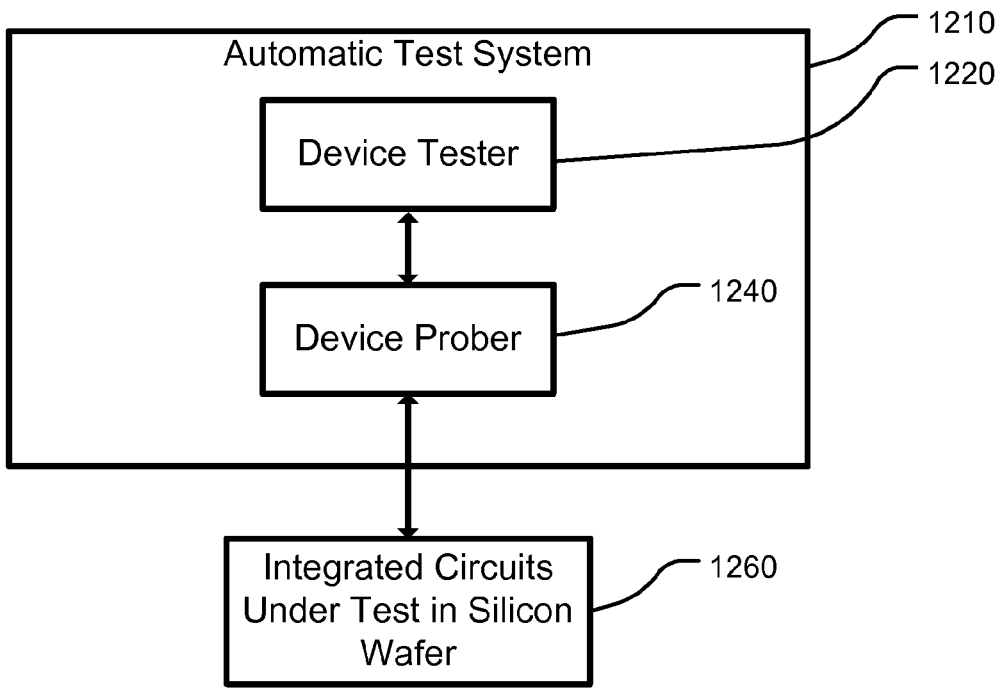
FIG. 12A and FIG. 12B are block diagrams of example automatic test systems.
Figure 12B:
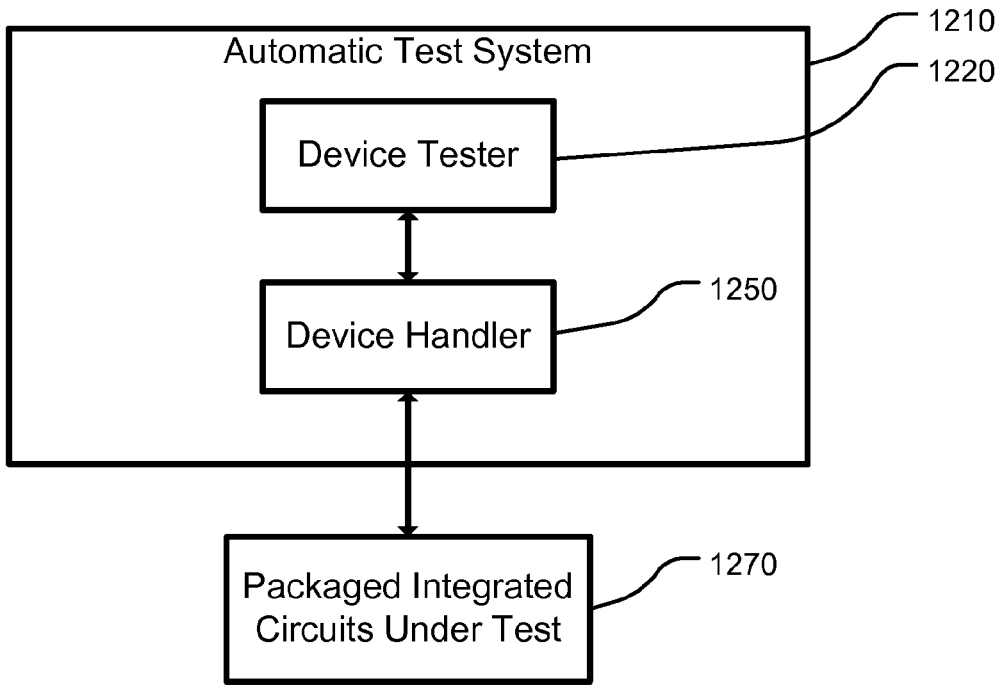

Automated test systems have been developed to improve integrated circuit test efficiency. A typical automatic test system may include multiple device testers, multiple device probers, multiple device handlers, and multiple interface test adapters. A device tester may interact with a device prober to test integrated circuits in silicon wafer. A device may also interact with a device handler to test packaged integrated circuits. FIG. 12A is a block diagram of an example automatic test system 1210 where a device tester 1220 is coupled with a device prober 1240 to test integrated circuits 1260 in a silicon wafer. FIG. 12B is a block diagram of the example automatic test system 1210 where the device tester 1220 is coupled with a device handler 1250 to test packaged integrated circuits 1270.

An example memory device under test in the automatic test system 1210, whether it is packaged or in a silicon wafer, may be the integrated circuit 1100, illustrated in FIG. 11, including a memory array 1110 implemented using phase change memory cells. During manufacturing of the memory array 1110, the automatic test system 1210 performs the actions identified in the flowchart in FIG. 3 and alternatively in the flowchart in FIG. 6 to block leakage current in a memory array.

Accordingly, the automatic test system 1210 writes test patterns to predetermined memory addresses in the memory array 1110, reads back contents at the predetermined memory addresses, and compares the read back contents with expected results. The automatic test system 1210 may write such patterns as all zeros, all ones, surround-and-attack, etc. using a test pattern generator. An all-zeros pattern writes logic zeros to all memory cells at predetermined memory addresses. An all-ones pattern writes logic ones to all memory cells at predetermined memory addresses. A surround-and-attack pattern keeps certain memory cells unchanged while toggling memory cells physically adjacent to the certain memory cells. The test pattern generator may use customized algorithms to generate test patterns as needed. The automatic test system 1210 may repeat testing with the same test patterns under varying process, voltage, and temperature conditions. Consequently, the automatic test system 1210 identifies addresses of defective memory cells in the memory array 1110, and reassigns the addresses to a redundant row 1110r or a redundant column 1110c of memory cells so that, logically, the memory array 1110 does not have any defective memory cells.

However, defective memory cells in the memory array 1110 may still leak current. Subsequently, the automatic test system 1210 applies, or causes on-chip circuitry to apply, a modifying bias condition to modify the defective memory cells at the identified addresses. The modifying bias condition causes the defective memory cells to transform into a current blocking condition. The automatic test system 1210 also stores the identified addresses of defective memory cells in the redundancy table 1180.

In one embodiment, the automatic test system 1210 applies, or causes the application of, a first modifying bias condition that causes a first electrical current pulse or pulses to cause a volume of the phase change material to form into a high resistance state. In a second embodiment, the automatic test system 1210 applies, or causes the application of, a second modifying bias condition that causes a second electrical current pulse or pulses to cause a volume of the phase change material that extends from a bottom electrode to a top electrode in the memory element to form into a high resistance state. In a third embodiment, the automatic test system 1210 supplies, or causes the application of, a third modifying bias condition that causes a third electrical current pulse or pulses to render the defective access device electrically non-conductive.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for blocking current leakage through defective memory cells in a memory array, the memory cells including access devices and programmable resistance memory elements, comprising:
    identifying addresses of defective memory cells in the memory array; and
    applying a modifying bias condition to modify programmable resistance memory elements in the defective memory cells at the identified addresses, forming modified defective memory cells having a current blocking condition under bias conditions applied during operation of the array, wherein the modifying bias condition is different from the bias conditions.

2. The method of claim 1, further comprising:
    storing the identified addresses of defective memory cells in a redundancy table of addresses.

3. The method of claim 1, wherein the modifying bias condition causes an electrical current pulse or pulses to render the access device in the modified defective cell electrically non-conductive.

4. The method of claim 1, wherein the memory element comprises a phase change material.

5. The method of claim 1, wherein the access devices comprise diodes.

6. An automatic test system, comprising:
    a device tester adapted to identify addresses of defective memory cells in a memory array in an integrated circuit under test, and to apply a modifying bias condition to modify programmable resistance memory elements in the defective memory cells at the identified addresses, forming modified defective memory cells having a current blocking condition under bias conditions applied during operation of the array, wherein the modifying bias condition is different from the bias conditions;
    wherein the memory array includes memory cells including access devices and programmable resistance memory elements;
    wherein the integrated circuit under test includes a redundant array, including replacement memory cells, and a redundancy table, the redundancy table mapping the identified addresses of modified defective memory cells in the memory array to replacement memory cells in the redundant array.

7. The system of claim 6, wherein the device tester is further adapted to store the identified addresses of modified defective memory cells in the redundancy table.

8. The system of claim 6, wherein the modifying bias condition causes an electrical current pulse or pulses to render the access device in the modified defective memory cell electrically non-conductive.

9. The system of claim 6, further comprising a device handler adapted to couple the integrated circuit under test in a package to the device tester.

10. The system of claim 6, further comprising a device prober adapted to couple the integrated circuit under test in a silicon wafer to the device tester.

11. An integrated circuit, comprising:
    a memory array, the memory array including memory cells including access devices and programmable resistance memory elements coupled to the access devices, and including a plurality of modified defective memory cells in a current blocking condition;
    a redundant array, including replacement memory cells; and
    a redundancy table, the redundancy table mapping addresses of the plurality of modified defective memory cells in the memory array to replacement memory cells in the redundant array,
    wherein the modified defective memory cells include a modified memory element comprising phase change material and having a high resistance active region.

12. The integrated circuit of claim 11, wherein the modified memory cells include a modified memory element in a current blocking condition.

13. A method for blocking current leakage through defective memory cells in a memory array, the memory cells including access devices and programmable resistance memory elements, comprising:

identifying addresses of defective memory cells in the memory array; and applying a modifying bias condition to modify the defective memory cells at the identified addresses, forming modified defective memory cells having a current blocking condition under bias conditions applied during operation of the array, wherein the memory cells include memory elements that comprise a phase change memory material having an active region which changes phase under bias conditions applied during operation of the array, and the modifying bias condition causes an electrical current pulse or pulses which induce a volume of the phase change material to adopt an amorphous phase to block current flow in the modified defective memory cell.

14. The method of claim 13, wherein the volume of the phase change material extends from a bottom electrode to a top electrode in the memory element.

15. An automatic test system, comprising:

a device tester adapted to identify addresses of defective memory cells in a memory array in an integrated circuit under test, and to apply a modifying bias condition to modify the defective memory cells at the identified addresses, forming modified defective memory cells having a current blocking condition under bias conditions applied during operation of the array;

wherein the memory array includes memory cells including access devices and programmable resistance memory elements;

wherein the integrated circuit under test includes a redundant array, including replacement memory cells, and a redundancy table, the redundancy table mapping the identified addresses of modified defective memory cells in the memory array to replacement memory cells in the redundant array;

wherein the memory cells include memory elements that comprise a phase change memory material having an active region which changes phase under bias conditions applied during operation of the array, and the modifying bias condition causes an electrical current pulse or pulses which induce a volume of the phase change material to adopt an amorphous phase to block current flow in the modified defective memory cell.

16. The system of claim 15, wherein the volume of the phase change material extends from a bottom electrode to a top electrode in the memory element.

17. An integrated circuit, comprising:

a memory array, the memory array including memory cells including access devices and programmable resistance memory elements coupled to the access devices, and including a plurality of modified defective memory cells in a current blocking condition, wherein the modified defective memory cells include a modified diode in a current blocking condition for forward and reverse bias, or a modified memory element comprising phase change material and having a high resistance active region;

a redundant array, including replacement memory cells;

a redundancy table, the redundancy table mapping addresses of the plurality of modified defective memory cells in the memory array to replacement memory cells in the redundant array; and built-in self-test circuitry adapted to identify addresses of defective memory cells in the memory array in the integrated circuit, and to apply a modifying bias condition to modify defective memory cells at the identified addresses, forming modified defective memory cells having a current blocking condition under bias conditions applied during operation of the array, wherein the modifying bias condition is different from the bias conditions.

18. The integrated circuit of claim 17, wherein the built-in self-test circuitry is further adapted to store the identified addresses of defective memory cells in the redundancy table.

19. The integrated circuit of claim 17, wherein the memory cells include memory elements that comprise a phase change memory material having an active region which changes phase under bias conditions applied during operation of the array, and the modifying bias condition causes an electrical current pulse or pulses which induce a volume of the phase change material to adopt an amorphous phase to block current flow in the modified defective memory cell.

20. The integrated circuit of claim 17, wherein the memory cells include memory elements that comprise a phase change memory material having an active region which changes phase under bias conditions applied during operation of the array, and the modifying bias condition causes an electrical current pulse or pulses which induce a volume of the phase change material that extends from a bottom electrode to a top electrode in the memory element to adopt an amorphous phase.

21. The integrated circuit of claim 17, wherein the modifying bias condition causes an electrical current pulse or pulses to render the access device in the modified defective memory cell electrically non-conductive.

* * * * *